(12) United States Patent  
Yamazawa et al.

(10) Patent No.: US 8,426,045 B2  
(45) Date of Patent: Apr. 23, 2013

(54) INTERNAL-RESISTANCE MEASURING DEVICE FOR RESPONSE-DELAY TYPE FUEL CELL

(75) Inventors: Akira Yamazawa, Tokyo (JP); Yoshiyuki Ueno, Tokyo (JP); Kazuya Watanabe, Tokyo (JP); Takefumi Shimoyama, Sendai (JP)

(73) Assignee: Kajima Corporation, Tokyo (JP)

( * ) Notice: Subject to any disclaimer, the term of this patent is extended or adjusted under 35 U.S.C. 154(b) by 155 days.

(21) Appl. No.: 12/921,985

(22) PCT Filed: Oct. 29, 2008

(86) PCT No.: PCT/JP2008/069660  
§ 371 (c)(1),  
(2), (4) Date: Sep. 10, 2010

(87) PCT Pub. No.: WO2009/113203  
PCT Pub. Date: Sep. 17, 2009

(65) Prior Publication Data  
US 2011/0020671 A1 Jan. 27, 2011

(30) Foreign Application Priority Data  
Mar. 14, 2008 (JP) ................. 2008-065314

(51) Int. Cl.  
*H01M 8/16* (2006.01)

(52) U.S. Cl.  
USPC .............................. 429/2; 429/431

(58) Field of Classification Search .................. 324/430; 429/2, 431  
See application file for complete search history.

(56) References Cited

U.S. PATENT DOCUMENTS

| | | | | |
|---|---|---|---|---|
| 4,652,501 A | * | 3/1987 | Bennetto et al. | 429/2 |
| 2006/0222924 A1 | * | 10/2006 | Matsuoka | 429/34 |

FOREIGN PATENT DOCUMENTS

| | | |
|---|---|---|
| JP | 2003-234119 | 8/2003 |
| JP | 2004-31256 | 1/2004 |
| JP | 2004-235043 | 8/2004 |
| JP | 2007-66590 | 3/2007 |
| JP | 2007-227216 | 9/2007 |

OTHER PUBLICATIONS

"Electrochemical Measuring Manual—Basic Edition":, Maruzen Co., Ltd., 2002, pp. 94.

* cited by examiner

*Primary Examiner* — Ula C Ruddock  
*Assistant Examiner* — Scott J Chmielecki  
(74) *Attorney, Agent, or Firm* — Greenblum & Bernstein P.L.C.

(57) ABSTRACT

One object is to provide a measuring device configured to evaluate the power generation characteristics of a response-delay type fuel cell automatically, precisely, and with excellent reproducibility with consideration of the response delay against power load fluctuations, and effectively acclimatize and develop microorganisms that are provided to generate power. A potentio-galvanostat is connected to a microbial fuel cell provided as an exemplary response-delay type fuel cell. Further, an automatic measuring device is connected to the potentio-galvanostat. The automatic measuring device has a program function and measures the internal resistance of the microbial fuel cell at set time. The internal resistance measurement is executed through the automatic measuring device that instructs the potentio-galvanostat to change a current value flowing to the microbial fuel cell and that repeatedly executes the process of measuring and recording a voltage value of the microbial fuel cell and the current value while changing a current control value in stages after the voltage value is stabilized.

9 Claims, 19 Drawing Sheets

US 8,426,045 B2

INTERNAL-RESISTANCE MEASURING DEVICE FOR RESPONSE-DELAY TYPE FUEL CELL

TECHNICAL FIELD

The present invention relates to an internal-resistance measuring device evaluating the electrochemical characteristic of a fuel cell delaying a response to power load fluctuations.

BACKGROUND ART

Hitherto, the method of finding the internal resistance of an object of measurement by continuously changing a voltage in accordance with time within a fixed range and measuring a current to evaluate the electrochemical characteristic of the object of measurement including a fuel cell, a secondary battery, and so forth has been performed (see Patent Document 1, for example).

Further, the method of executing measurement by waiting until a voltage is stabilized while changing a load in stages by hand has been performed.

Further, cyclic voltammetry which is widely used for the study of the oxidation-reduction potential of a substance in solution, an electrode substance, etc. and/or an electrode reaction mechanism (the charge transfer, an associated chemical reaction, adsorption, etc.) has been known. The cyclic voltammetry is performed by reciprocally executing the potential scan. In the case where the cyclic voltammetry is performed, a correct measurement cannot be made unless conditions are not met, where the conditions include being under no influence of convection because an electrode and/or solution remains at rest, being under no influence of migration because a supporting electrolyte dissolves and ionizes sufficiently, using a plane electrode so that a linear diffusion pattern is achieved, no reactant deposited on an electrode and occurrence of no chemical reaction, the electron transfer being reversible, and so forth. (see Non-Patent Document 1, for example).

On the other hand, next-generation fuel cells including a biofuel cell, a fuel cell using liquid fuel, and so forth have been developed. The biofuel cell includes an enzyme fuel cell using an enzyme for an electrode, a microbial fuel cell using a microorganism for an electrode, and so forth. The enzyme fuel cell is a fuel cell generating power through the oxidation-reduction enzyme of an electrode.

Further, the fuel cell using the liquid fuel denotes a fuel cell that uses an inorganic catalyst (e.g., platinum) for an anode and that uses liquid fuel including methanol, ethanol, etc. The liquid fuel has higher molecular weight and high energy density. However, the reactivity of the liquid fuel is rather low.

Particularly, the microbial fuel cell expected to be a next-generation type bioenergy recovery process can directly produce electric energy from biomass through biochemical conversion. It has been expected that the use of the device allows for eliminating energy losses occurring when fuel generated through the methane fermentation and/or the hydrogen fermentation is converted through the use of a power generator. (See Patent Document 2, for example.)

[Patent Document 1] Japanese Unexamined Patent Application Publication No. 2007-66590 (the eighth page)

[Patent Document 2] Japanese Unexamined Patent Application Publication No. 2007-227216

[Non-Patent Document 1] The Electrochemical Society Ed. "Electrochemical Measurement Manual Basic version", Maruzen Company, Limited, April in 2002, p. 94

DISCLOSURE OF INVENTION

Problems to be Solved by the Invention

However, the enzyme fuel cell and the microbial fuel cell have a large amount of solution and require time to achieve a state of equilibrium. Further, since the liquid fuel-using type fuel cell uses liquid fuel including methanol, ethanol, and so forth, where the liquid fuel has higher molecular weight and high energy density even though the reactivity of the liquid fuel is rather low, the problem of response delay occurs. Here, those fuel cells wherein the response delay occurs are collectively referred to as response-delay type fuel cells. Hereinafter, problems occurring during the measurement of the response-delay type fuel cell will be described by taking the microbial fuel cell as an example, as a representative of the response-delay type fuel cell.

Hereinafter, a known method of measuring the microbial fuel cell will be described with reference to drawings.

FIG. 14 is a block diagram of a method for measuring the internal resistance of the microbial fuel cell through the use of a known automatic measuring method performed by determining a fuel cell, a secondary battery, and so forth to be an object of measurement. A waveform generation device 27 specifies a voltage that should be applied to the microbial fuel cell 7 for a potentio-galvanostat 5. The waveform generation device 27 instructs the potentio-galvanostat 5 to apply a voltage shown in FIG. 15 to the microbial fuel cell 7, where the voltage performs sweeping within a fixed range. The measured value of a current value generated through the microbial fuel cell 7 is transmitted to a computer-for-analysis 29.

FIG. 19($a$) shows a result of known and ordinary automatic measurement performed through the waveform generation device 27. When the measurement is correctly performed, the result should agree with a result of manual measurement which will be described later (FIG. 19($b$)). However, the result diverges vastly from the manual measurement result, which means that the measurement is not correctly performed.

The response-delay type fuel cell including the microbial fuel cell or the like delays a response to power load fluctuations. Therefore, there has been the problem of incorrect measurement of the characteristic of the response-delay type fuel cell, which occurs when the known automatic measuring method performed by determining a fuel cell, a secondary battery, and so forth to be an object of measurement is used.

A known method of manually measuring the characteristic of the microbial fuel cell 7 will be described with reference to FIGS. 16 and 17. FIG. 16 shows a block diagram of the measurement, FIG. 17($a$) shows a circuit diagram of a measuring circuit, and FIG. 17($b$) shows the theory of measurement. An external resistor 31 is connected to the microbial fuel cell 7 and a measuring person changes a resistance value, as needed. After changing the resistance value, the measuring person measures a voltage value applied to both ends of the resistor 31 through the microbial fuel cell 7 by using an electrometer 33. After the measuring person determines that the voltage value is stabilized and/or a fixed time has elapsed, the measuring person inputs a measured value to the computer-for-analysis 29. Further, the measuring person inputs the resistance value of the resistor 31 to the computer-for-analysis 29.

According to FIG. 17($a$), a measured voltage $E_1$ is a voltage indicated by the electrometer 33, and an external resistance $R_1$ is the resistance value of the external resistor 31. According to Ohm's law, $E_1 = I_1 \times R_1$ holds, and $E_1$ and $R_1$ are known, $I_1$ is calculated. Next, electromotive force $E_0$ and internal resistance $R_0$ of the microbial fuel cell 7 are calculated. According to Ohm's law, $E_0=I_1\times(R_1+R_0)$ holds, and assigning and modifying the expression lead to $E_1=-I_1\times R_0+E_0$. Therefore, when the voltage $E_1$ is measured while changing the current $I_1$, and a current is plotted on the x-axis and a voltage is plotted on the y-axis as shown in FIG. 17(b), the linear relation with slope $-R_0$ and intercept $E_0$ on the y-axis is obtained.

Results of the known manual measurement are shown in FIGS. 18 and 19.

FIG. 18 is a diagram of voltage values that are measured through the electrometer 33 and that are plotted in time sequence. After five minutes have elapsed since the measurement was started from constant resistance mode where an external resistance of 1 kΩ is connected, the circuit of resistance is interrupted and the stabilization of an output voltage of the microbial fuel cell 7 is waited. After further thirty minutes have elapsed, the resistor 31 is shifted to 100 kΩ and the stabilization of the output voltage is waited. After further ten minutes have elapsed, the resistor 31 is shifted to 10 kΩ and the stabilization of the output voltage is waited. Then, the resistor 31 is shifted to 2.4 kΩ, 1 kΩ, 440 Ω, and 100 Ω, and the resistor 31 is shifted to 1 kΩ after the measurement is finished. When the voltage of each of resistance values is read, and the current value is calculated and plotted, the plot of manual measurement is achieved as shown in FIG. 19(b). Since a criterion by which the measuring person determines that the output voltage is stabilized is ambiguous and an end open state where an external load is removed is temporarily achieved at the time when the resistor 31 is replaced, reproducibility is obtained with difficulty.

Although the reproducibility is assured to some extent when measurement is performed through a measuring person who is sufficiently skilled in the measurement, the success or failure of the measurement is determined based on the proficiency of the measuring person and the measuring person is restrained for long time.

Accordingly, when the response-delay type fuel cell such as the microbial fuel cell is measured by hand and the standby time is insufficient, the problem of incorrect measurement occurs. Further, even though the measurement can be correctly performed when the sufficient standby time is assured, it is preferable that the measurement be performed at 10 or more points to establish a smooth link between the measurement points. Therefore, when the standby of 10 minutes is needed for a single point, there has been the problem that the restraint time of the measuring person becomes 100 minutes only for the standby time even though the load change-operation time is excluded, and the measuring person is restrained for long time.

The fuel cell is a device operated over a long time period, and it is necessary to evaluate the characteristic on a regular basis over a long time period defined in several months. However, measuring the response-delay type fuel cell on a regular basis over several months means that a person skilled in measurement spends a time of at least 100 minutes for the measurement every several days, which increases the personal load significantly. Further, measuring the characteristics of a plurality of the fuel cells over a long time period is impossible in effect from the viewpoint of human resources, which inhibits the study and development of the response-delay type fuel cell. Further, during the manual measurement, a no-load state (open state) temporarily occurs at the resistor replacement time, which is particularly unfavorable for stabilization of the microbial fuel cell and affects the reproducibility.

Further, the microbial fuel cell is characterized by having a large amount of solution and/or many culture mediums, and microorganisms existing and growing in the culture mediums, the microorganisms being provided as an electrode, which does not satisfy the precondition of the cyclic voltammetry. Therefore, an ordinary cyclic voltammetry measurement evaluation method cannot be used to evaluate the characteristic of the microbial fuel cell.

The present invention has been achieved in consideration of the above-described problems. The object of the present invention is to provide a measuring device that evaluates the power generation characteristic of a response-delay type fuel cell automatically, precisely, and with excellent reproducibility with due consideration of the response delay against power load fluctuations.

Means for Solving the Problems

For achieving the above-described object, the first invention is an internal-resistance measuring device measuring an internal resistance of a response-delay type fuel cell, where the internal-resistance measuring device comprises a constant current-control means configured to control a current flowing to the internal-resistance measuring device so that the current attains a current control value, a current measuring means configured to measure the current flowing to the internal-resistance measuring device, a voltage measuring means configured to measure a voltage changed by the internal-resistance measuring device, a calculating means configured to wait until the voltage is stabilized, and a recording means configured to record a value of the current and a value of the voltage after the voltage is stabilized, wherein the current control value of the constant current-control means is changed, measurement of the current and the voltage is repeated a predetermined number of times, and the internal resistance of the response-delay type fuel cell is calculated and recorded from a plurality of measurement points.

Further, it is preferable that the internal-resistance measuring device be capable of switching between enablement and disablement of each of a recording function provided to record a value of a current flowing through the internal-resistance measuring device and the value of the voltage changed by the internal-resistance measuring device on a regular basis, and a control function provided to control the current flowing through the internal-resistance measuring device, and start the internal resistance measurement at predetermined and/or manual time and return to a state attained before the measurement is started after the internal resistance-measurement is finished.

Further, it is preferable that control be performed so that the current flowing through the internal-resistance measuring device becomes zero when the voltage value falls below a predetermined value.

Further, it is preferable that the control function be any one of constant current control provided to perform control so that a predetermined current value flows to the response-delay type fuel cell, constant resistance control provided to perform control so that a current value that should be flown when an external resistance with a predetermined resistance value is connected to the response-delay type fuel cell is flown, and constant voltage control provided to control a current so that the voltage value changed by the internal-resistance measuring device becomes a predetermined voltage value, wherein the current control value is changed by as much as a set amount for every lapse of specified time.

Further, it is preferable that the constant resistance control comprise a step of measuring the voltage changed by the internal-resistance measuring device through the voltage measuring means, a step of calculating a current that should be flown when a predetermined resistance is connected to the response-delay type fuel cell according to Ohm's law based on the voltage value and the resistance value through the calculating means, and a step of controlling the calculated current so that the current flows to the response-delay type fuel cell through the constant current-control means.

Further, it is preferable that the internal-resistance measuring device comprise a constant voltage-control means configured to control the voltage changed by the internal-resistance measuring device, and the constant resistance control comprise a step of measuring the current flowing through the internal-resistance measuring device through the current measuring means, a step of calculating a voltage changed by a predetermined resistance when the predetermined resistance is connected to the response-delay type fuel cell according to Ohm's law based on the current value and the resistance value through the calculating means, and a step of controlling a voltage so that the voltage is changed by as much as the voltage calculated through the internal-resistance measuring device through the constant voltage-control means.

It is preferable that the response-delay type fuel cell is a microbial fuel cell, and the internal-resistance measuring device alternately performs acclimatization of the microbial fuel cell and internal resistance measurement.

Advantages

The present invention allows for providing a measuring device configured to evaluate the power generation characteristic of a response-delay type fuel cell automatically, precisely, and with excellent reproducibility with due consideration of the response delay against power load fluctuations.

Figure 1:
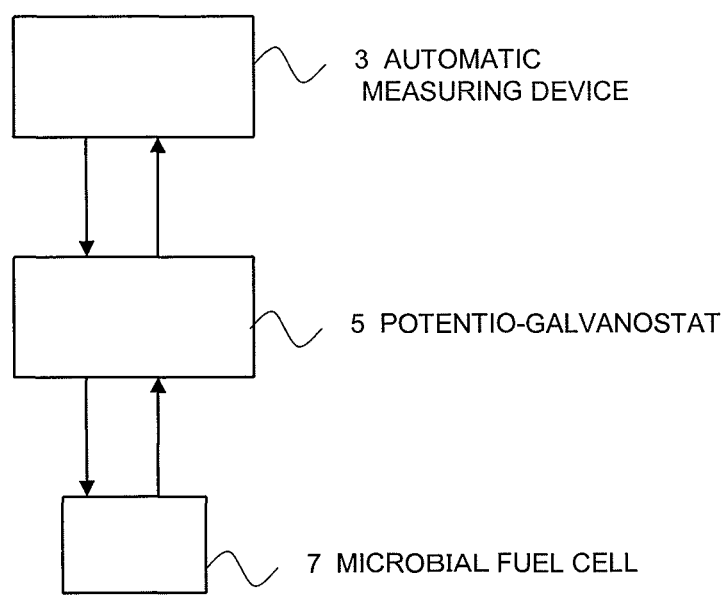
FIG. 1 is a diagram showing the configuration of the embodiment.

| Reference Numerals | |
|---|---|
| 3 | automatic measuring device |
| 5 | potentio-galvanostat |
| 7 | microbial fuel cell |
| 9 | anaerobic culture tank |
| 11 | anode |
| 13 | culture medium |
| 15 | microorganism |
| 17 | cathode chamber |
| 19 | cathode |
| 21 | buffer solution |
| 23 | airpipe |
| 25 | separator |
| 27 | waveform generation device |
| 29 | computer-for-analysis |
| 31 | resistor |
| 33 | electrometer |

BEST MODES FOR CARRYING OUT THE INVENTION

Hereinafter, embodiments of the present invention will be described in detail with reference to drawings. A microbial fuel cell typifying a response-delay type fuel cell is used as an object of measurement.

FIG. 1 shows a system evaluating the characteristics of a microbial fuel cell 7. A potentio-galvanostat 5 is connected to the microbial fuel cell 7. Further, an automatic measuring device 3 is connected to the potentio-galvanostat 5.

The automatic measuring device 3 includes a current specifying means, a current reading means, a voltage reading means, a calculating means, a recording means, and a display means. The current specifying means specifies a current control value which should be controlled for the potentio-galvanostat 5, and the values of a current and a voltage that are measured through the potentio-galvanostat 5 are read through the current reading means and the voltage reading means, and are recorded through the recording means. Further, the automatic measuring device 3 includes a screen as the display means.

Further, the automatic measuring device 3 includes an internal timer function, is able to perform the internal resistance measurement at arbitrary time and choose whether or not a recording function should be enabled, includes a manual measurement-start button that allows for performing the internal resistance measurement at arbitrary time and a setting button provided to proceed to a setting routine, and is able to choose whether or not a control function should be enabled, where the control function allows for selecting the constant current control, the constant resistance control, and the constant voltage control.

The internal timer performs count-up during the execution of processing of any type. Further, once the control function is selected, the selected state is maintained unless the selection is cancelled and/or a voltage becomes lower than the minimum set value during control so that the selection is automatically cancelled.

Further, the automatic measuring device 3 includes a logging screen which is a screen where a measured value is plotted. Recording data onto the logging screen denotes plotting the measured value on the logging screen and storing the measured value in an internal memory.

Figure 17:
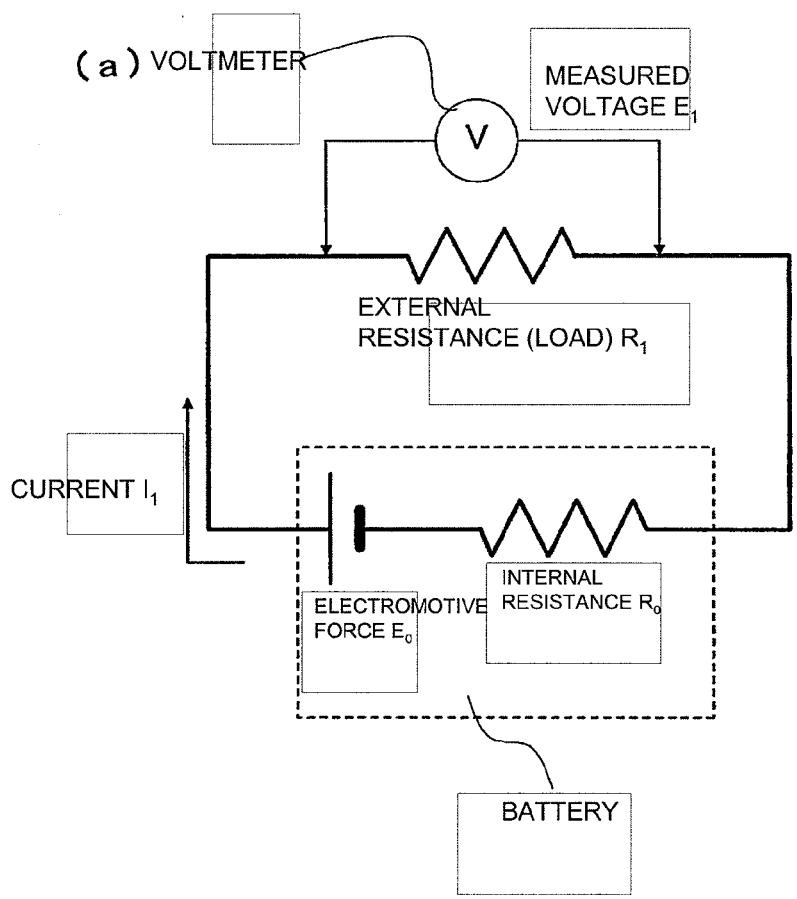
[FIG. 17 ] (a) is a circuit diagram showing an occasion when an internal resistance is manually measured, and (b) is an ideal plot diagram showing an occasion when the internal resistance is manually calculated.
Figure 17:
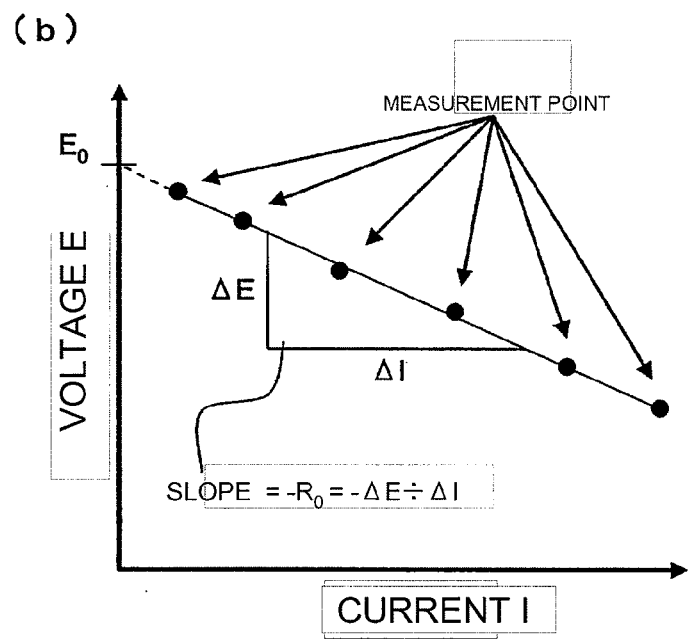
Figure 18:
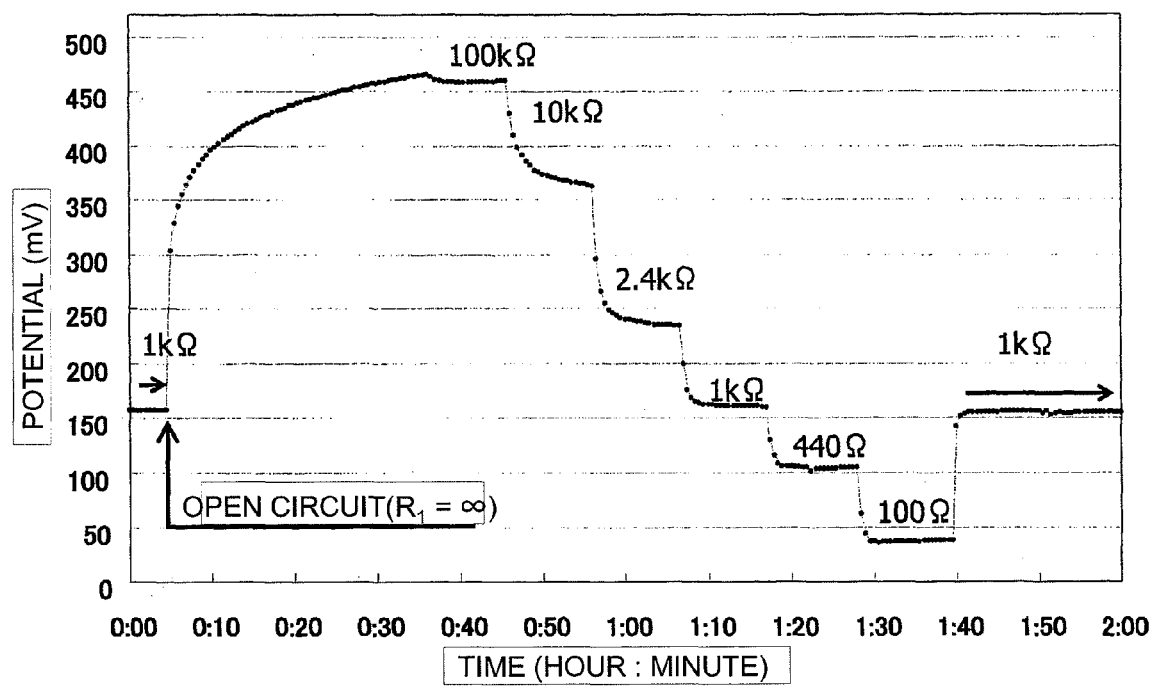
FIG. 18 is a diagram illustrating time changes in a voltage value, which are observed at an occasion when manual measurement is performed.
Figure 19:
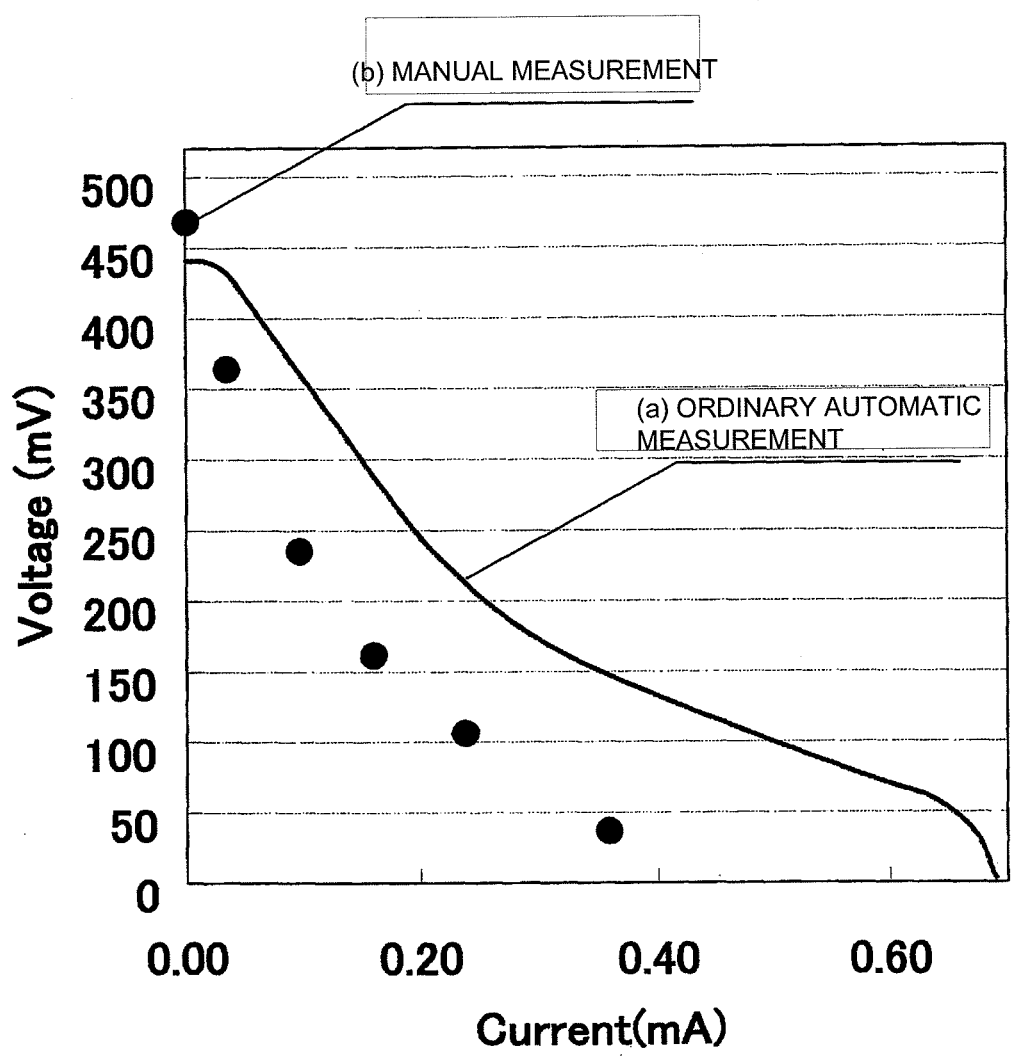
[FIG. 19] (a) is a plot diagram of automatically measured current voltages, and (b) is a plot diagram of manually measured current voltages.

The potentio-galvanostat 5 includes a constant current-control means, a current measuring means, and a voltage measuring means. The constant current-control means performs control so that the current of the current control value specified through the current specifying means of the automatic measuring device 3 flows to the microbial fuel cell 7, the current measuring means measures the current flowing through the microbial fuel cell 7 ($I_1$ shown in FIG. 17(a)), and the voltage measuring means measures the circuit voltage changed through the potentio-galvanostat 5 ($E_1$ shown in FIG. 17(a)). Hereinafter, the current value denotes the value corresponding to $I_1$ and the voltage value denotes the value corresponding to $E_1$, except where specifically noted.

Figure 2:
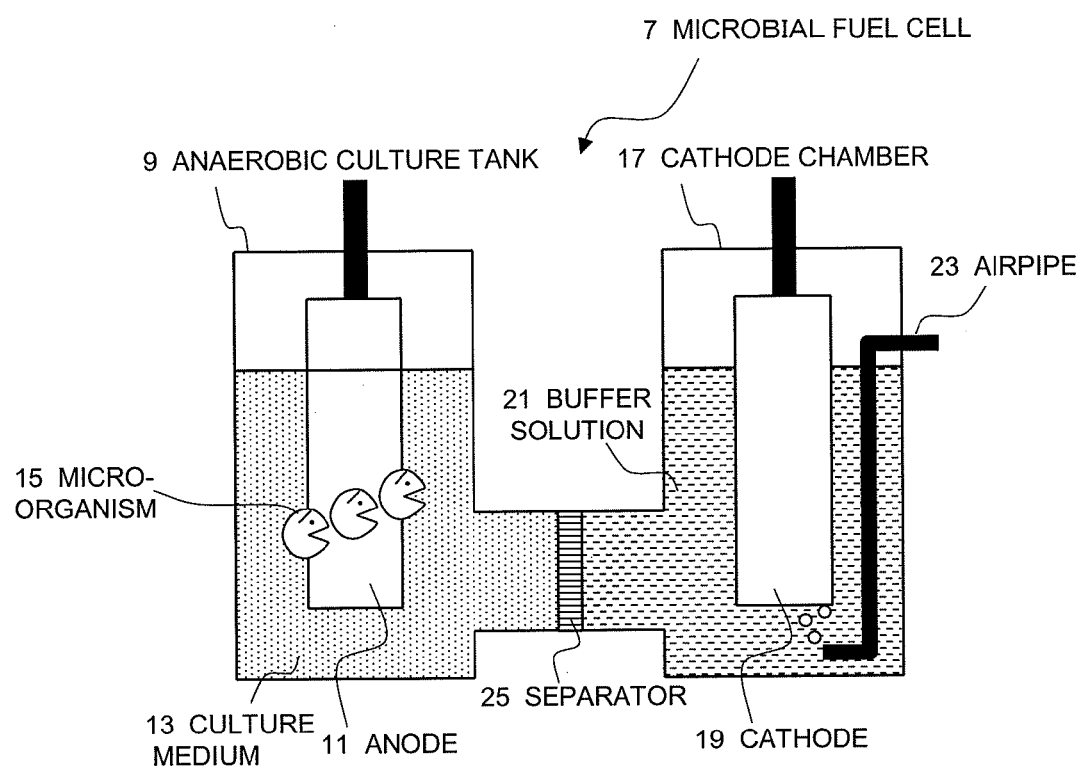
FIG. 2 is a schematic diagram of a microbial fuel cell 7 according to the embodiment.

In the microbial fuel cell 7, an anaerobic culture tank 9 including an anode 11 is connected to a cathode chamber 17 including a cathode 19 through the use of a separator 25, as shown in FIG. 2. The anaerobic culture tank 9 is filled with a culture medium 13, and microorganisms 15 are cultured in the anode 11 and the culture medium 13. Further, the cathode chamber 17 is filled with a buffer solution 21 and the cathode 19 is exposed to air through an airpipe 23.

The anaerobic culture tank 9 is a tank provided to perform anaerobic fermentation of an organic matter. It is preferable that a nitrogen gas, a carbonic acid gas, and so forth substitute for an upper gas phase portion so that the anaerobic condition is attained. The methane fermentation performed through the use of an organic matter is a well-known and ordinary technology, and operations may be performed in the anaerobic culture tank 9 under normal conditions as is the case with the methane fermentation of the organic matter.

It is preferable that the anode 11 include a fibrous graphite electrode to increase the adhesion properties of microorganisms.

The culture medium 13 includes the organic matter used for the methane fermentation. A mediator may be added to the culture medium 13. It is preferable that the pH of the culture medium be maintained at 6 to 8.

The microorganisms 15 are a microorganisms oxidizing an acid-producing microorganism and an organic matter under anaerobic conditions, and may include wide-ranging microorganism sources including an activated sludge, paddy soils, and so forth in addition to microorganisms that are used for ordinary methane fermentation.

An oxidizer such as potassium ferricyanide may be added to the cathode chamber 17. Further, the cathode 19 includes a graphite electrode or the like, and the airpipe 23 exposes the cathode 19 to a gas including oxygen.

It is preferable that the separator 25 be a material that can intercept oxygen, where a charged substance such as an ion can pass through the material. It is preferable that the separator 25 be an ion exchange membrane such as a hydrogen ion exchange membrane.

An exemplary method of measuring the current and voltage of the microbial fuel cell 7 through the automatic measuring device 3 and the potentio-galvanostat 5 will be described with reference to FIGS. 3 to 8.

Figure 3:
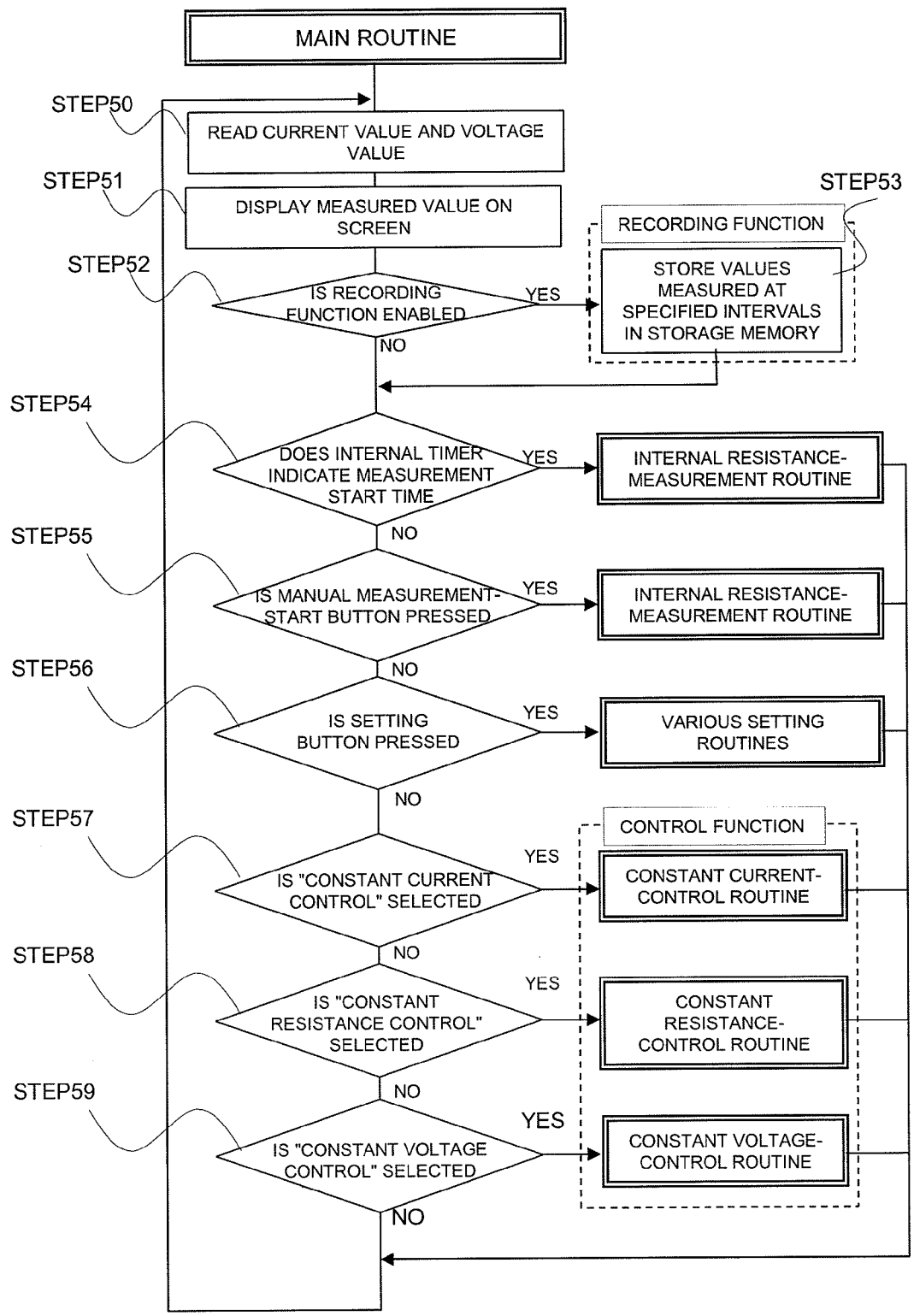
FIG. 3 is a diagram showing a main routine of an automatic measuring device 3 according to the embodiment.

FIG. 3 shows the general flow of the measuring method of the automatic measuring device 3. First, the automatic measuring device 3 reads a current value and a voltage value from the potentio-galvanostat 5 (step 50), and displays a measured value on the screen provided as the display means (step 51). The automatic measuring device 3 determines whether or not the recording function is enabled (step 52), and stores the current value and the voltage value in a storage memory provided as the recording means at specified intervals (step 53) when the recording function is enabled (Yes at step 52). The automatic measuring device 3 proceeds to step 54 when the recording function is not enabled (No at step 52) and after step 53 is finished. An internal-resistance measuring routine is executed when the internal timer of the automatic measuring device 3 determines that it is the measurement start time (Yes at step 54), and when the manual measurement-start button of the automatic measuring device 3 is pressed (Yes at step 55). On the other hand, when the automatic measuring device 3 determines that it is not the measurement start time (No at step 54), when the manual measurement-start button is not pressed (No at step 55), and when the setting button of the automatic measuring device 3 is pressed (Yes at step 56), the automatic measuring device 3 proceeds to various setting routines. When the setting button of the automatic measuring device 3 is not pressed (No at step 56), the selection of methods of the control function is confirmed (steps 57 to 59). The automatic measuring device 3 proceeds to a constant current-control routine when the "constant current control" of the automatic measuring device 3 is selected (Yes at step 57), proceeds to a constant resistance-control routine when the "constant resistance control" is selected (Yes at step 58), and proceeds to a constant voltage-control routine when the "constant voltage control" is selected (Yes at step 59). Here, the automatic measuring device 3 returns to step 50 when any of the control methods is not selected (No at step 59) and when the internal resistance-measurement routine, the various setting routines, the constant current-control routine, the constant resistance-control routine, and the constant voltage-control routine are finished.

Figure 4:
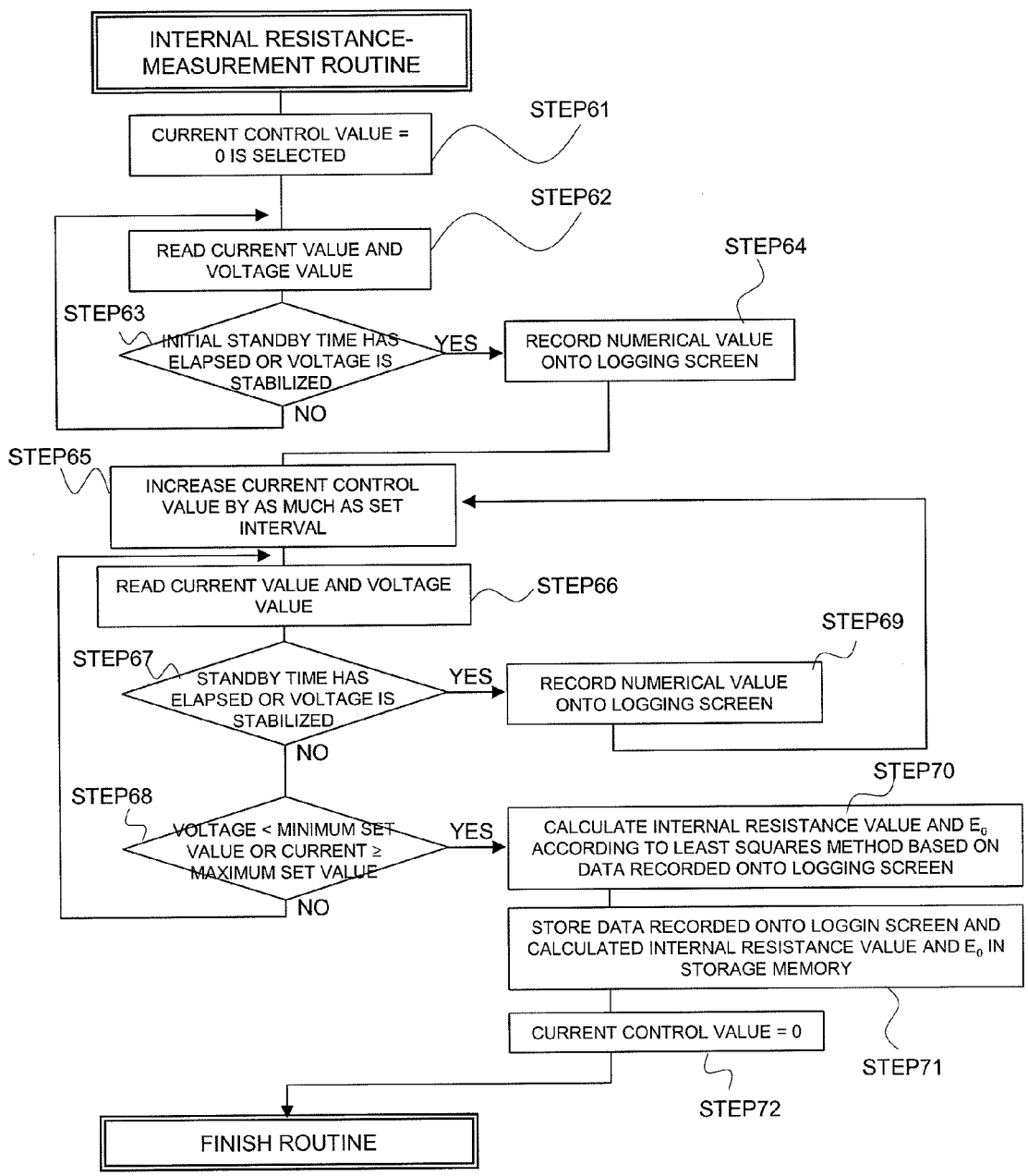
FIG. 4 is a diagram showing an internal-resistance measuring routine of the automatic measuring device 3 according to the embodiment.

The internal resistance-measurement routine performed through the automatic measuring device 3 will be described with reference to FIG. 4. When the internal resistance-measurement routine is started, in the automatic measuring device 3, the current specifying means sets a current (current control value) which should be controlled through a constant current-control unit of the potentio-galvanostat 5 to 0 (step 61). Subsequently, the automatic measuring device 3 reads the current value and the voltage value from the potentio-galvanostat 5 (step 62). The automatic measuring device 3 returns to step 62 again when the automatic measuring device 3 determines that an initial standby time period has not elapsed and/or the voltage is not stabilized (No at step 63). That is to say, steps 62 and 63 are repeated unless the automatic measuring device 3 determines that the initial standby time period has elapsed and/or the voltage is stabilized (Yes at step 63). The automatic measuring device 3 plots the current value and the voltage value on the logging screen produced on the screen and stores the current value and the voltage value in the internal memory (step 64), and the current specifying means increases the current control value by as much as a set interval (step 65).

Subsequently, the automatic measuring device 3 reads the current value and the voltage value from the potentio-galvanostat (step 66), and plots the measured value on the logging screen produced on the screen and stores the measured value in the internal memory (step 69), and the automatic measuring device 3 returns to step 65 when it is determined that the standby time has elapsed and/or the voltage is stabilized (Yes at step 67).

Figure 12:
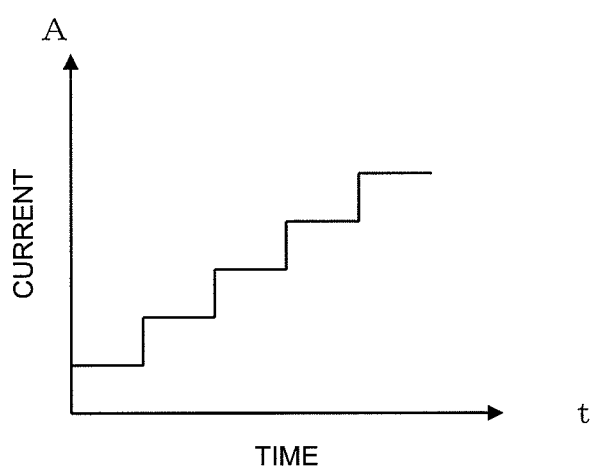
FIG. 12 illustrates time changes in the current control value of a potentio-galvanostat 5 according to the embodiment.

Time changes in the current control value specified through the automatic measuring device 3 for the potentio-galvanostat 5 will be described with reference to FIG. 12. As shown in FIG. 12, the specified current values that are specified through the automatic measuring device 3 for the potentio-galvanostat 5 are not continuous. After being changed, the current control value is maintained for a while until the voltage value is stabilized, and is changed in a step-like manner in relation to the time.

Further, when the automatic measuring device 3 determines that the standby time has not elapsed and/or the voltage is not stabilized (No at step 67), and determines that the voltage is higher than the minimum set value and the current is lower than the maximum set value (No at step 68), the automatic measuring device 3 returns to step 66 again. On the other hand, when the automatic measuring device 3 determines that the voltage is lower than the minimum set value and the current is higher than the maximum set value (Yes at step 68), the internal resistance value and the voltage value of the microbial fuel cell are calculated based on data recorded onto the logging screen through approximation such as the least squares method (step 70) and are stored in the storage memory (step 71), the current control value is set to 0 (step 72), and the internal resistance-measurement routine is finished.

Figure 5:
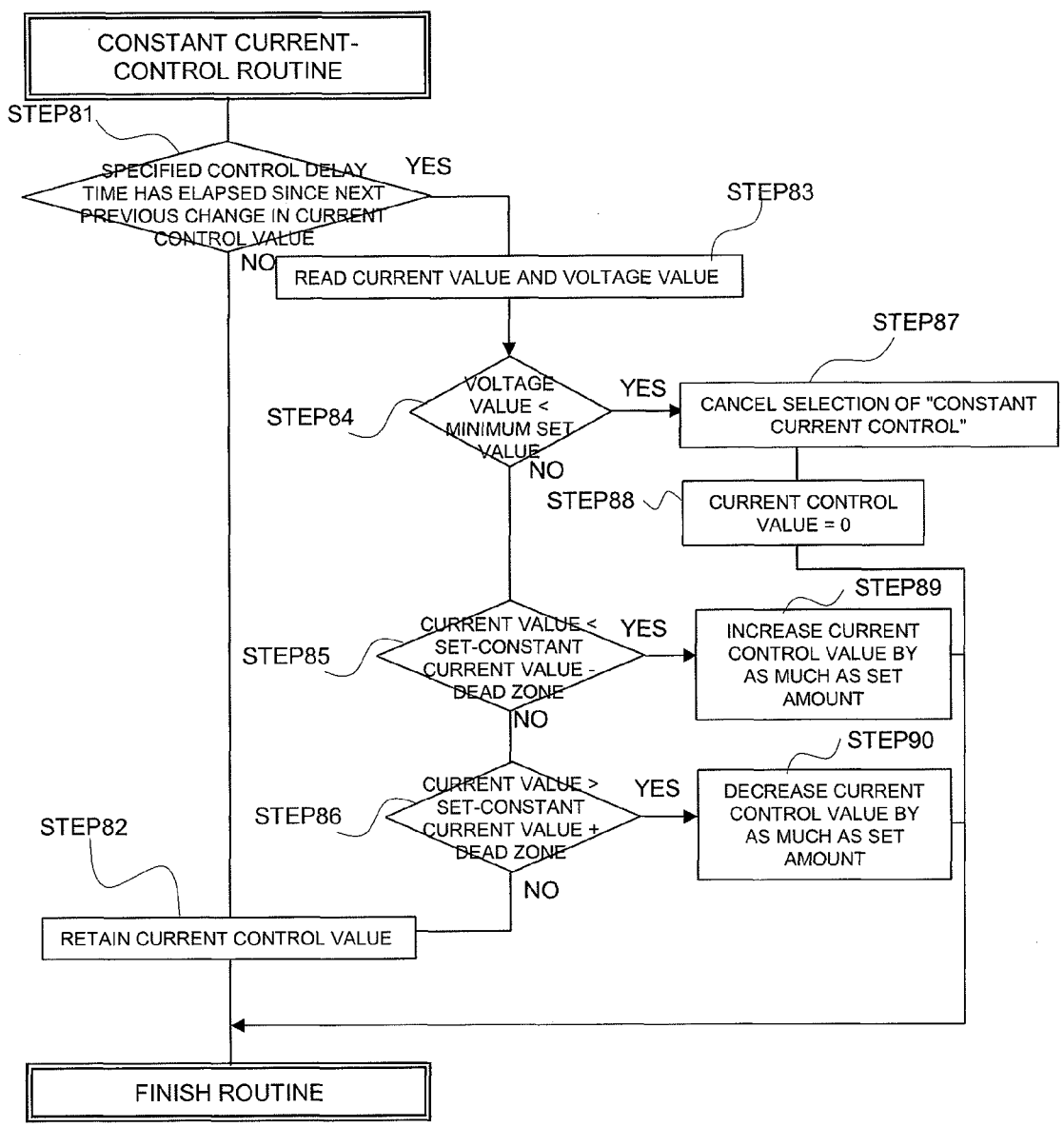
FIG. 5 is a diagram showing a constant current-control routine of a control function of the automatic measuring device 3 according to the embodiment.

The constant current-control routine will be described with reference to FIG. 5. When the constant current-control routine is started, the automatic measuring device 3 determines whether or not a specified time has elapsed since the next previous change in the current control value (step 81). When the automatic measuring device 3 determines that the specified time has not elapsed (No at step 81), the current control value is retained without being changed (step 82), and the constant current-control routine is finished. Further, when the automatic measuring device 3 determines that the specified time has elapsed (Yes at step 81), the voltage value and the current value are read from the potentio-galvanostat (step 83), and it is determined whether or not the voltage value is smaller than the minimum set value (step 84). When the automatic measuring device 3 determines that the voltage value is smaller than the minimum set value (Yes at step 84), the automatic measuring device 3 cancels the selection of the "constant current control" (step 87), sets the current control value to 0 (step 88), and finishes the constant current-control routine. When the voltage value is larger than the minimum set value (No at step 84), the current value is compared to a set-constant current value (steps 85 and 86). When the automatic measuring device 3 determines that the current value is smaller than a value obtained by subtracting a dead zone from the set-constant current value (Yes at step 85), the current control value is increased by as much as a set amount (step 89), and the constant current-control routine is finished. Further, when the automatic measuring device 3 determines that the current value is larger than a value obtained by adding the dead zone to the set-constant current value (Yes at step 86), the current control value is reduced by as much as a set amount (step 90), and the constant current-control routine is finished. Further, when the automatic measuring device 3 determines that the current value falls within a range defined with consideration of the dead zone in addition to the set-constant current value (No at step 86), the current control value is retained (step 82), and the constant current-control routine is finished.

Figure 6:
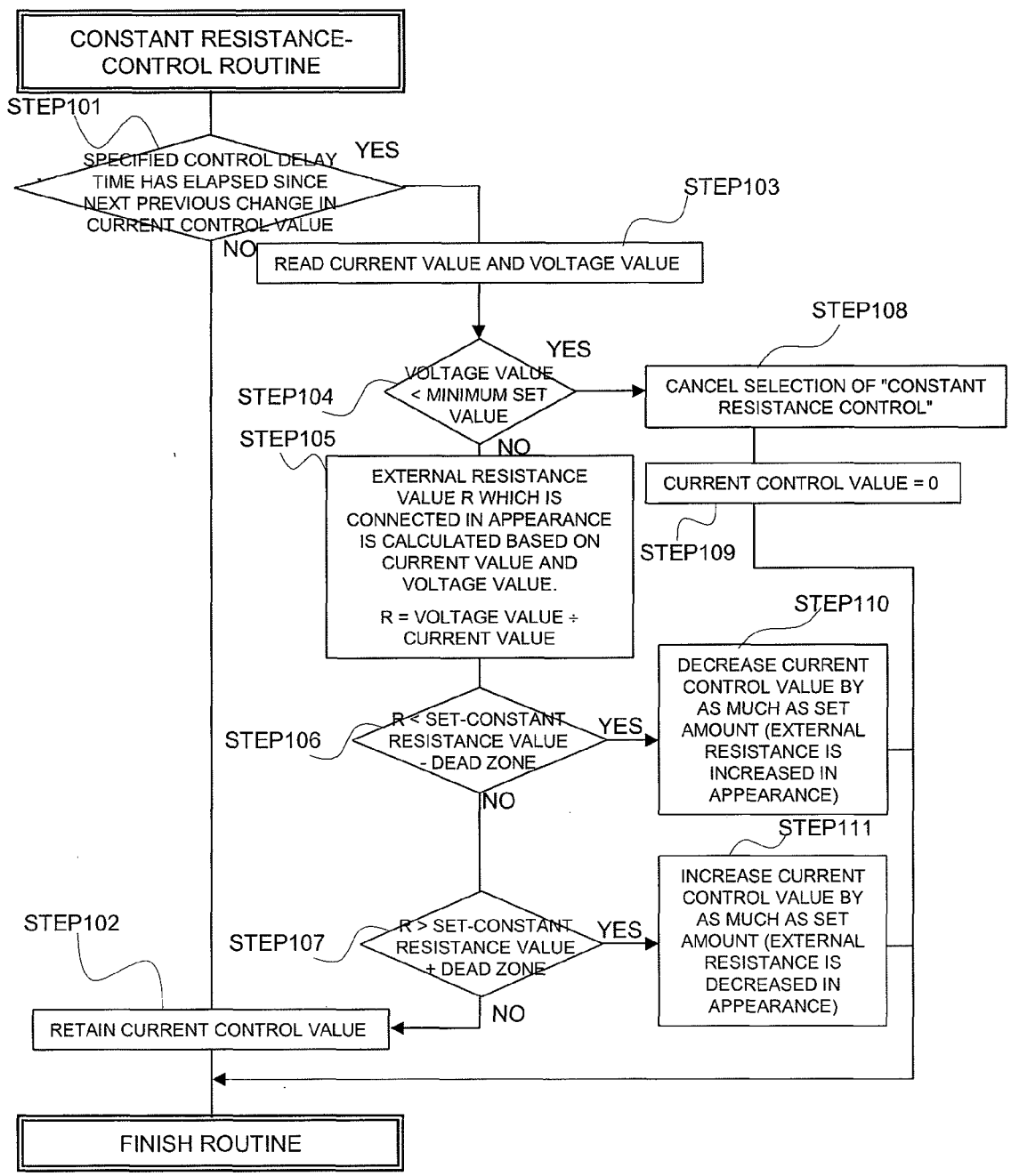
FIG. 6 is a diagram showing a constant resistance-control routine of the control function of the automatic measuring device 3 according to the embodiment.

The constant resistance-control routine will be described with reference to FIG. 6. When the constant resistance-control routine is started, the automatic measuring device 3 determines whether or not a specified time has elapsed since the next previous change in the current control value (step 101). When the automatic measuring device 3 determines that the specified time has not elapsed (No at step 101), the current control value is retained without being changed (step 102), and the constant resistant-control routine is finished. Further, when the automatic measuring device 3 determines that the specified time has elapsed (Yes at step 101), the voltage value and the current value are read from the potentio-galvanostat 5 (step 103), and it is determined whether or not the voltage value is smaller than the minimum set value (step 104). When the automatic measuring device 3 determines that the voltage value is smaller than the minimum set value (Yes at step 104), the automatic measuring device 3 cancels the selection of the "constant resistance control" (step 108), sets the current control value to 0 (step 109), and finishes the constant resistance-control routine. When the voltage value is larger than the minimum set value (No at step 104), an external resistance value R which is externally connected in appearance is calculated based on the current value and the voltage value (step 105), and the external resistance value R is compared to the set-constant resistance value (steps 106 and 107). When the automatic measuring device 3 determines that the external resistance value R is smaller than a value obtained by subtracting a dead zone from the set-constant resistance value (Yes at step 106), the current control value is decreased by as much as a set amount (step 110), and the constant resistance-control routine is finished. Further, when the automatic measuring device 3 determines that the external resistance value R is larger than a value obtained by adding the dead zone to the set-constant resistance value (Yes at step 107), the current control value is increased by as much as a set amount (step 111), and the constant resistance-control routine is finished. Further, when the automatic measuring device 3 determines that the external resistance value R falls within a range defined with consideration of the dead zone in addition to the set-constant resistance value (No at step 107), the current control value is stored (step 102), and the constant resistance-control routine is finished.

Figure 7:
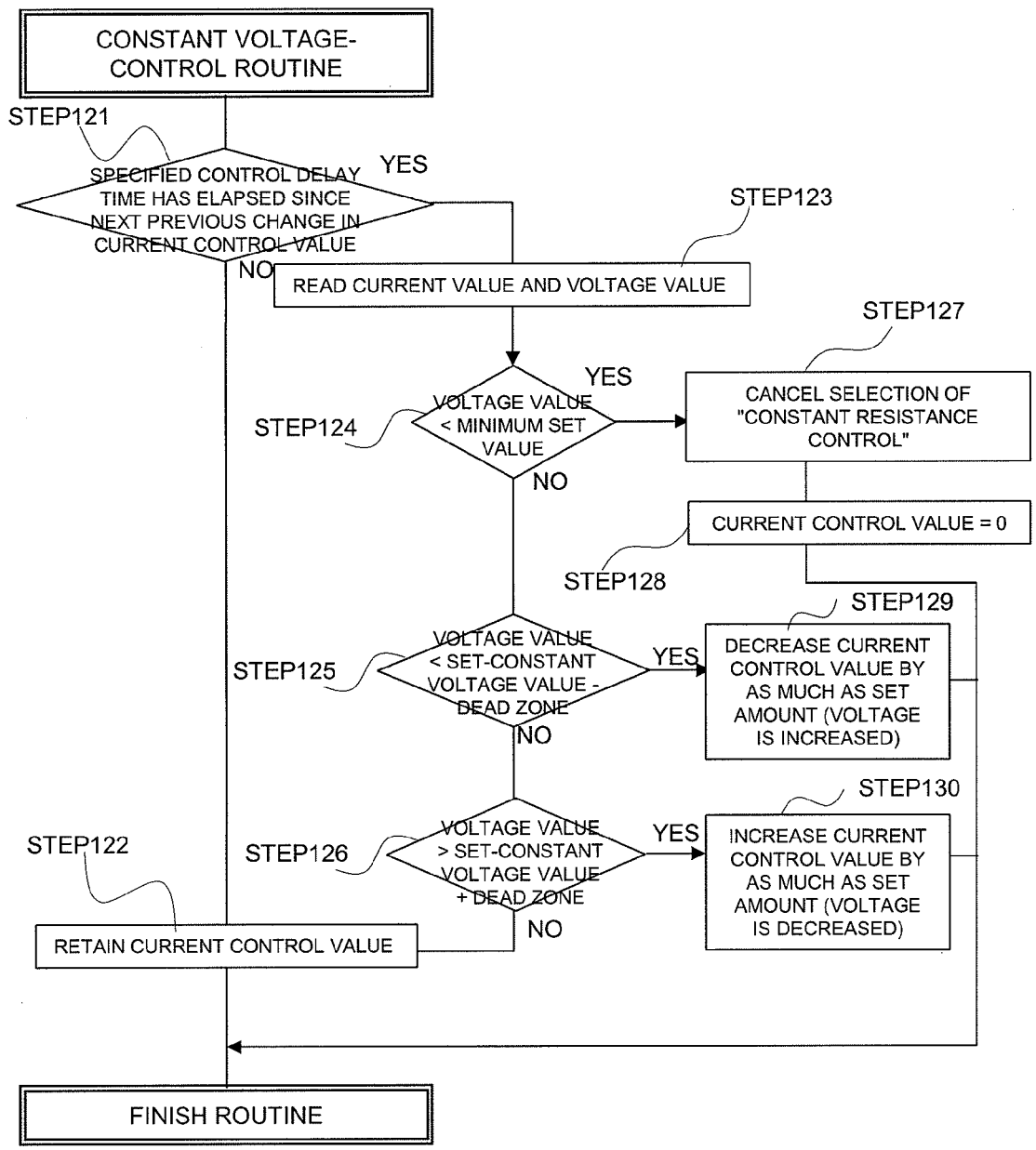
FIG. 7 is a diagram showing a constant voltage-control routine of the control function of the automatic measuring device 3 according to the embodiment.

The constant voltage-control routine will be described with reference to FIG. 7. When the constant voltage-control routine is started, the automatic measuring device 3 determines whether or not a specified time has elapsed since the next previous change in the current control value (step 121). When the automatic measuring device 3 determines that the specified time has not elapsed (No at step 121), the current control value is retained without being changed (step 122), and the constant voltage-control routine is finished. Further, when the automatic measuring device 3 determines that the specified time has elapsed (Yes at step 121), the voltage value and the current value are read from the potentio-galvanostat 5 (step 123), and it is determined whether or not the voltage value is smaller than the minimum set value (step 124). When the automatic measuring device 3 determines that the voltage value is smaller than the minimum set value (Yes at step 124), the automatic measuring device 3 cancels the selection of the "constant voltage control" (step 127), sets the current control value to 0 (step 128), and finishes the constant voltage-control routine. When the voltage value is larger than the minimum set value (No at step 124), the voltage value is compared to a set-constant voltage value (steps 125 and 126). When the automatic measuring device 3 determines that the voltage value is smaller than a value obtained by subtracting a dead zone from the set-constant voltage value (Yes at step 125), the current control value is decreased by as much as a set amount (step 129), and the constant voltage-control routine is finished. Further, when the automatic measuring device 3 determines that the voltage value is larger than a value obtained by adding the dead zone to the set-constant voltage value (Yes at step 126), the current control value is increased by as much as a set amount (step 130), and the constant voltage-control routine is finished. Further, when the automatic measuring device 3 determines that the voltage value falls within a range defined with consideration of the dead zone in addition to the set-constant voltage value (No at step 126), the current control value is retained (step 122), and the constant voltage-control routine is finished.

Since the microbial fuel cell 7 for control is slow to respond in the constant current-control routine, the constant resistance-control routine, and the constant voltage-control routine, a control routine characterized in that the current control value is not changed at one time, but is changed by as much as a set amount every specified time is attained.

Further, in the above-described embodiment, the potentio-galvanostat 5 is used in constant current-control mode so that the current control value is also changed in the constant voltage-control routine while the voltage is monitored. Here, when the potentio-galvanostat 5 and the automatic measuring device 3 are integrated, it becomes possible to automatically switch between the constant current control and the constant voltage control. Subsequently, it becomes possible to control the voltage value while monitoring the voltage in the constant voltage-control routine, and it becomes possible to control the voltage value while monitoring the current in the constant resistance-control routine.

Figure 8:
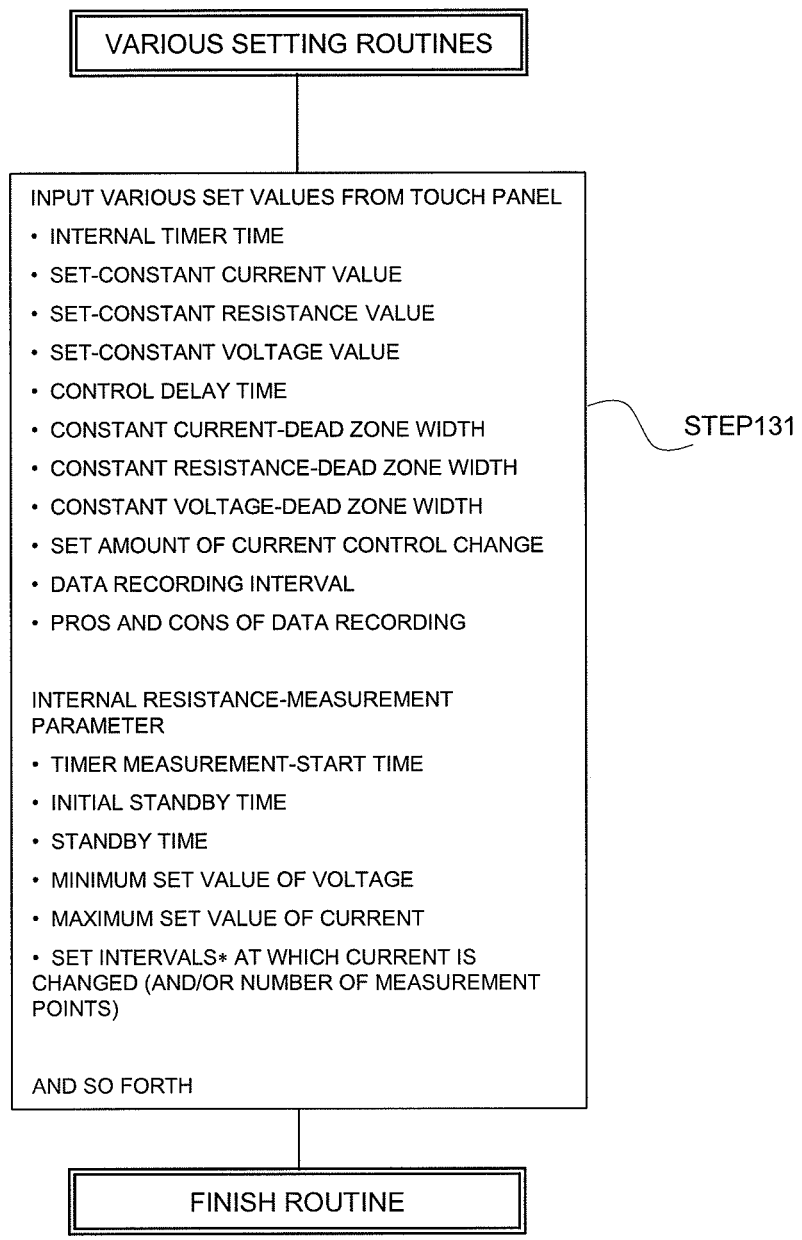
FIG. 8 is a diagram showing various setting routines of the automatic measuring device 3 according to the embodiment.

The various setting routines will be described with reference to FIG. 8. When the various setting routines are started, various setting values are input and/or changed as required (step 131), and the various setting routines are finished.

Further, steps including steps 68 and 72, steps 84 and 88, steps 104 and 109, and steps 124 and 128 where the current control value is set to zero when the voltage value becomes equivalent to and/or smaller than the minimum set value are performed to reduce a negative voltage applied to the microbial fuel cell 7, which causes phenomenons compromising the characteristics of the microbial fuel cell 7, such as the death of microorganisms, being recharged due to the occurrence of reaction mediated by no microorganisms, etc.

Further, since the plotting is performed within the logging screen, it becomes possible to manually select an outlier and recalculate the internal resistance value.

Various using methods that are performed through the use of the internal-resistance measuring device performing the above-described operations may be considered. Hereinafter, using methods 1 to 8 will be illustrated in Table 1.

TABLE 1

|  | Recording function | Control function | Automatic-internal resistance measurement |
|---|---|---|---|
| Using method 1 | ○ | ○ | ○ |
| Using method 2 | ○ | x | ○ |
| Using method 3 | x | ○ | ○ |
| Using method 4 | x | x | ○ |
| Using method 5 | ○ | ○ | x |
| Using method 6 | ○ | x | x |
| Using method 7 | x | ○ | x |
| Using method 8 | x | x | x |

○: performed
x: not performed

Figure 9:
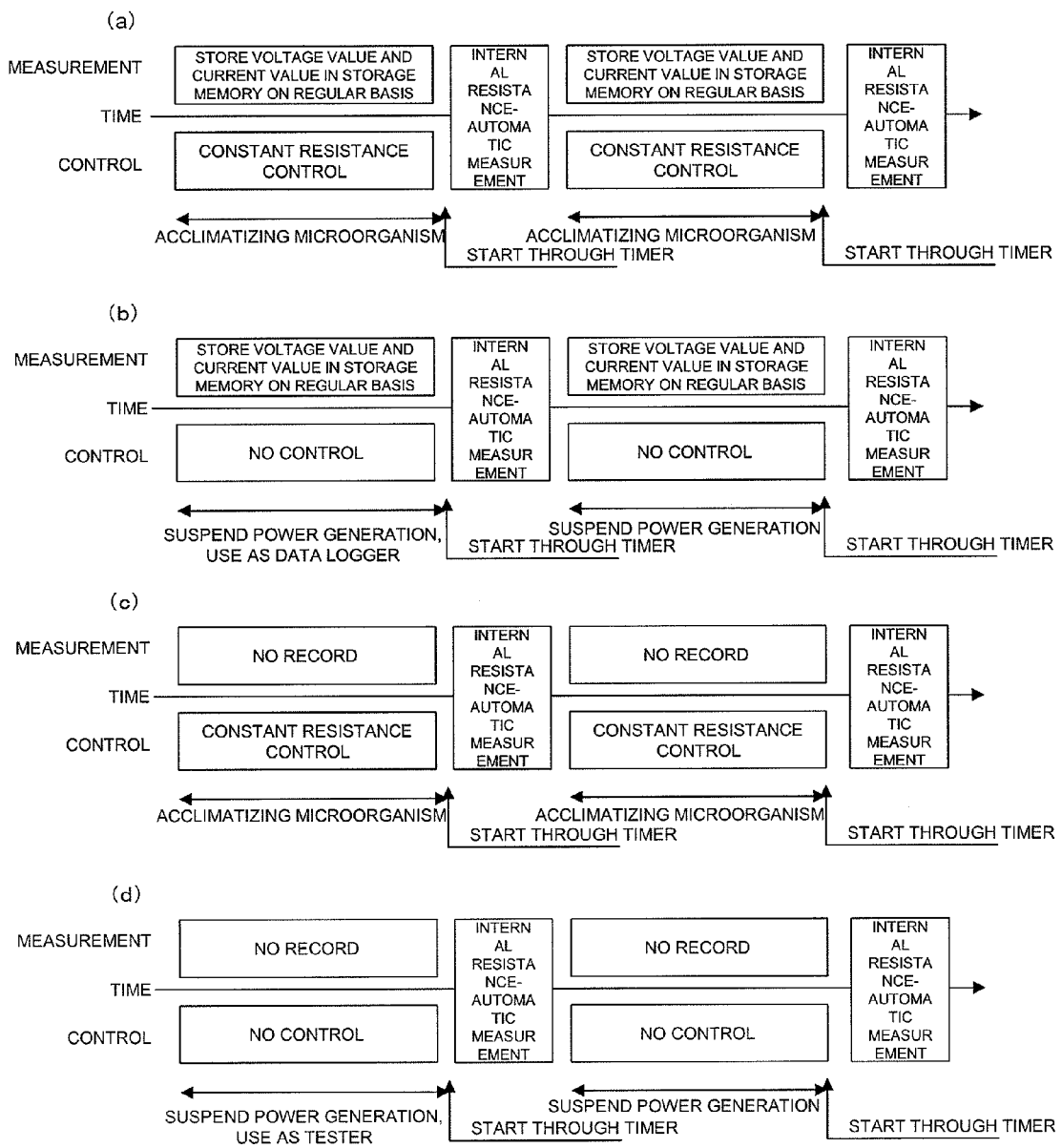
FIG. 9 is a diagram illustrating first to fourth using methods according to the embodiment.

According to the using method 1, the internal-resistance measuring device performs the internal resistance measurement on a regular basis in an execution state where both the recording function and the control function of the internal-resistance measuring device are enabled. According to the first using method, the internal-resistance measuring device measures a voltage and a current while acclimatizing microorganisms through the control function in most times, and automatically measures the internal resistance on a regular basis as shown in FIG. 9(a). The first using method is using mode where the functions of the internal-resistance measuring device are used most effectively.

According to the second using method, the internal-resistance measuring device automatically performs the internal resistance measurement in a passive state where the control function is disabled even though the recording function is enabled. According to the second using method, the internal-resistance measuring device automatically measures the internal resistance on a regular basis while collecting and recording the continuously measured values of a voltage as shown in FIG. 9(b). The current value is also stored at times other than the internal resistance-measurement time. However, since the numerical value is zero, only information of voltage (open-state potential) is significant. It becomes possible to measure how the internal resistance is changed in a no-load state (open state). For additional connection of an external resistance, correction calculation of the internal resistance needs to be performed after the measurement and/or an external load needs to be removed just before the internal resistance is measured.

According to the third using method, the internal-resistance measuring device automatically performs the internal resistance measurement in a control state where the control function is enabled even though the recording function is disabled. According to the third using method, the internal-resistance measuring device does not measure a voltage and a current during the acclimatization as shown in FIG. 9(c). The third using method is performed when the voltage value and the current value that are obtained during the acclimatization are not required, and only the acclimatization needs to be performed and the internal resistance needs to be automatically measured on a regular basis.

According to the fourth using method, the internal-resistance measuring device automatically performs the internal resistance measurement in a standby state where the recording function and the control function are disabled. The fourth using method is used when the internal resistance alone is measured on a regular basis as shown in FIG. 9(d). When an additional external load is connected for the acclimatization, the internal resistance including the external load is measured so that the internal resistance cannot be measured correctly. Therefore, the data correction needs to be performed after the measurement and/or the external load needs to be removed just before measuring the internal resistance.

Figure 10:
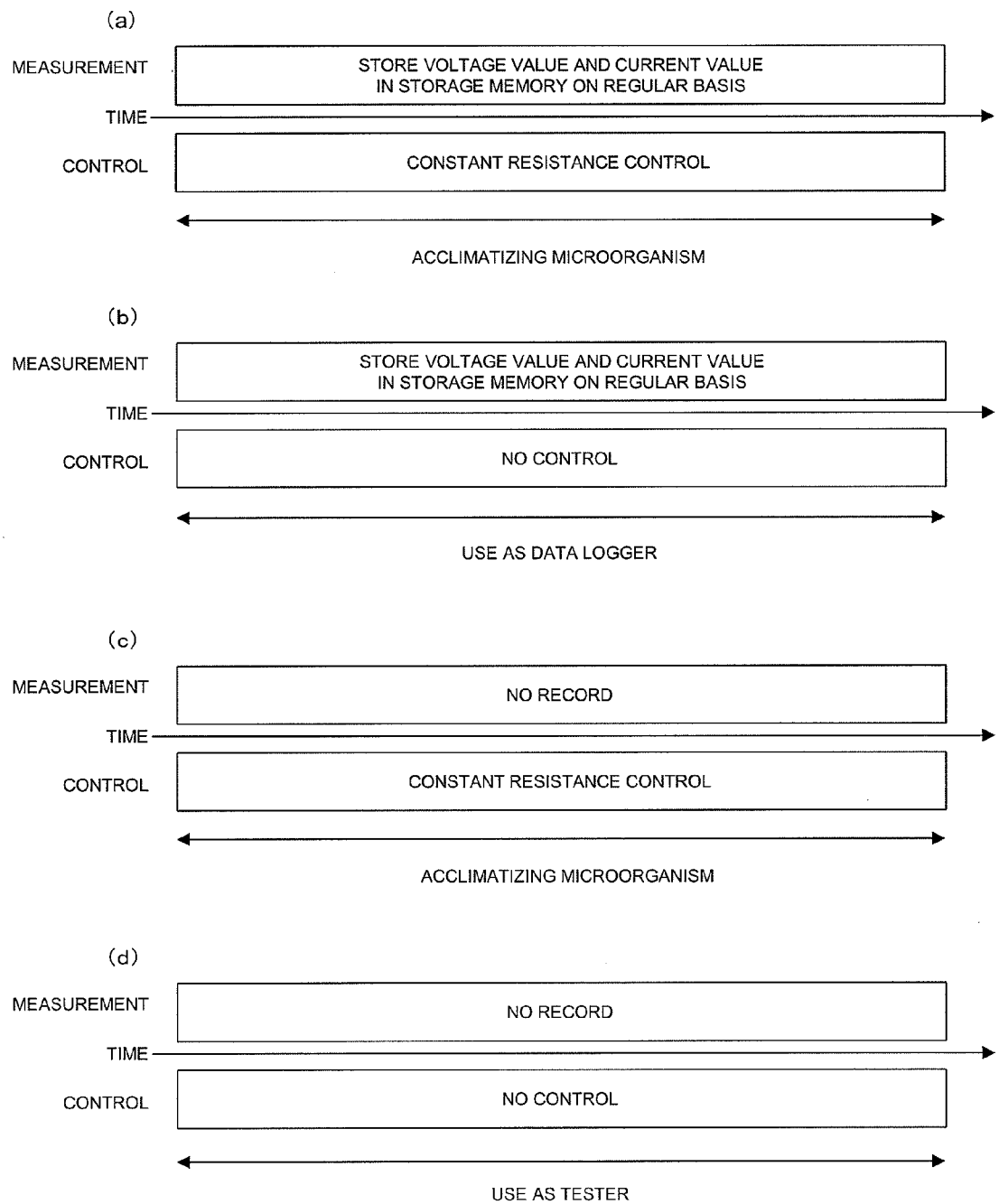
FIG. 10 is a diagram illustrating fifth to eighth using methods according to the embodiment.

According to the fifth using method, the internal-resistance measuring device does not measure the internal resistance automatically in an execution state where both the recording function and the control function are enabled. As shown in FIG. 10(a), the fifth using method allows for measuring the process of acclimatizing microorganisms and/or a change in the output of the microbial fuel cell 7 functioning as a power generator while extracting a current under the control. Further, the automatic measuring device 3 may be manually instructed to measure the internal resistance at arbitrary time.

According to the sixth using method, the internal-resistance measuring device does not measure the internal resistance automatically in a passive state where the control function is disabled even though the recording function is enabled. According to the sixth using method, the internal-resistance measuring device stores a measured value alone without performing control as shown in FIG. 10(b). The sixth using method is a using method of, for example, an ordinary data logger. Although the current value is stored, the numerical value is zero. Therefore, the method is performed as the continuous measurement of voltage. An external load may be additionally connected for use and/or the automatic measuring device 3 may be manually instructed to measure the internal resistance at arbitrary time.

According to the seventh using method, the internal-resistance measuring device does not measure the internal resistance automatically in a control state where the control function is enabled even though the recording function is disabled. As shown in FIG. 10(c), the seventh using method is used only when the execution of acclimatization of the microbial fuel cell 7 is desired even though the measured values of a voltage and a current are not needed. A measuring person may manually perform the internal resistance measurement. Although it is mere realization of the same state as when an additional resistor is connected as an external load, the removal of the external load and the trouble of reconnection are not necessary when the internal resistance measurement is performed at arbitrary time.

According to the eighth using method, the internal-resistance measuring device does not automatically perform the internal resistance measurement in a standby state where the recording function and the control function are disabled. According to the eighth using method, the measurement of a voltage and a current, and the screen display are performed even though the recording function is disabled as shown in FIG. 10(c). Therefore, the eighth using method is used as a tester. After that, the use of the eighth using method may be considered during the wait for the time when the internal resistance measurement is started.

Figure 11:
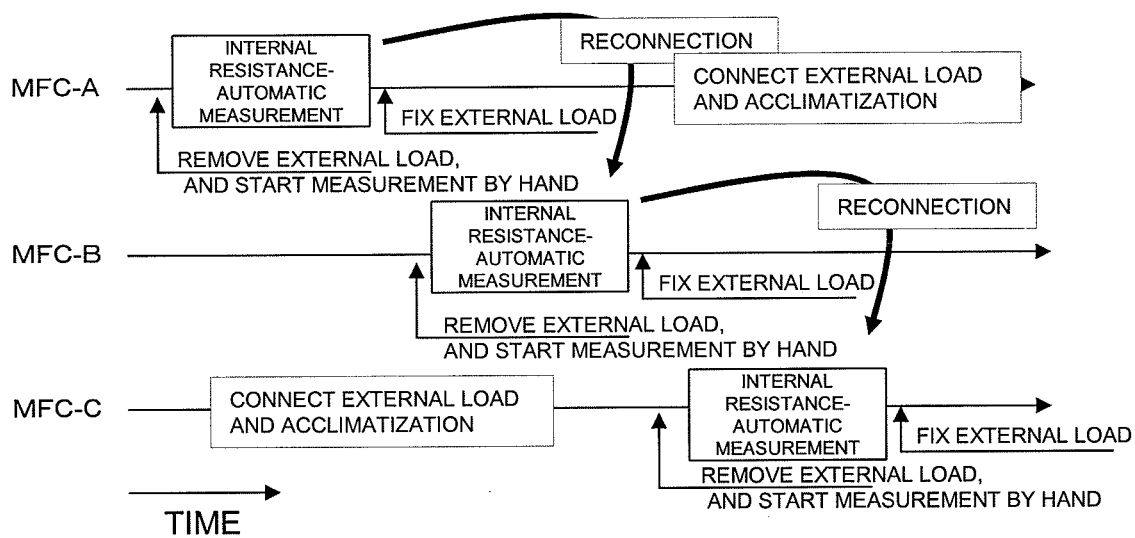
FIG. 11 is a diagram illustrating a ninth using method according to the embodiment.

The ninth using method is a method for measuring a plurality of microbial fuel cells (MFC) through a single internal-resistance measuring device. The ninth using method will be described with reference to FIG. 11. An external resistor (load) is connected to each of three microbial fuel cells MFC-A, MFC-B, and MFC-C, and the microbial fuel cells are acclimatized. First, the external load is removed from the MFC-A, the internal-resistance measuring device is connected to the MFC-A, and automatic measurement of the internal resistance is manually started. After the measurement is finished, the internal-resistance measuring device is removed from the MFC-A, the external load is fixed to the MFC-A, and the MFC-A is acclimatized. Next, the external load is removed from the MFC-B, the internal resistance automatic measuring device removed from the MFC-A is connected to the MFC-B, and the automatic measurement of the internal resistance is manually started. After the measurement is finished, the internal-resistance measuring device is removed from the MFC-B, the external load is fixed to the MFC-B, and the MFC-B is acclimatized. The measurement of the MFC-C is performed in a like-manner.

In the embodiment, even though a response-delay type fuel cell such as a microbial fuel cell has the property of responding to power load fluctuations more slowly, having a slower followability of a voltage value when a current value is fixed to a certain value, and having a slower followability of a current value when the voltage value is fixed to a certain value than a secondary battery, a fuel cell, etc. that had already been put to practical use, the response-delay type fuel cell can measure the power generation property with increased precision.

Further, in the embodiment, the measurement is performed through the automatic measuring device so that the result shows high reproducibility and repeated evaluations can be made easily compared with the method of performing the measurement after waiting until a voltage and/or a current is stabilized while gradually changing the load by hand. Further, since an end open state where no external load is connected does not occur at the load changing time, the measurement reproducibility is acquired with facility.

Further, in the embodiment, the ease of being accompanied by a mistake occurring due to long-time restraint under which the measuring person had been put during the measurement performed by hand is eliminated. Further, heavy personal load for executing the measurement of the microbial fuel cell repeatedly and/or executing the measurement of a plurality of the microbial fuel cells is eliminated, which makes it possible to repeatedly measure the microbial fuel cells.

Further, the embodiment allows for sending specified electricity to the microbial fuel cell and acclimatizing the microbial fuel cell when the power generation property of the microbial fuel cell is not measured.

Further, the embodiment allows for avoiding losses of the power generation property of the microbial fuel cell by suspending currents flowing into the microbial fuel cell when the voltage value becomes lower than a set value.

Further, in the embodiment, the constant resistant control appropriate to acclimatize the microbial fuel cell is provided. Although known evaluation devices for secondary batteries and/or fuel cells have often been provided with constant power control performed to keep power constant, but never have been provided with the constant resistance control. During the early stages of acclimatization, power generating microorganisms are particularly few, and both the current and the voltage are low in the microbial fuel cell. Therefore, it is clear that the acclimatization performed with constant power is undesirable for the growth of power generating microorganisms.

EXAMPLES

Hereinafter, the present invention will be described in detail with reference to examples.

A system executing the measuring method includes a commercial potentio-galvanostat and a control-and-measuring unit connected to the potentio-galvanostat. Although HA-151 manufactured through Hokuto Denko Corporation is necessary and sufficient in terms of functions and inexpensive as the potentio-galvanostat, the present invention is not limited to the above-described example. Further, the control-and-measuring unit includes a graphic panel, an instrumentation sequencer, a sequencer amplifier, a power unit, and so forth. In the system, the graphic panel is equipped with a touch panel, and is manufactured to confirm a measured value, set information, and so forth, and operate the system.

When performing the measurement, the control-and-measuring unit is connected, a measurement-control probe (connection terminal) of the potentio-galvanostat, which is set to galvanostat mode provided for the external input signal-control is connected to a cathode and an anode of the microbial fuel cell for measurement, and the potentio-galvanostat is controlled through a program installed into the sequencer from the control-and-measuring unit, which makes it possible to record and monitor the voltage value and the current value through the automatic measurement of a current-voltage curve and/or the constant resistance control (the same conduct as in the case of connection of a specified resistor is performed).

A general-purpose computer including an electric signal-input-and-output device, a single chip-microcomputer, and so forth may be substitutes for the control of the potentio-galvanostat. Further, external resistance values are sequentially changed by switching between devices on which at least two resistors are mounted through a relay and/or an electric rotary switch so that only the voltage value is measured, whereby the same functions can also be achieved.

An exemplary configuration of the microbial fuel cell 7 will be described below.

A microbial fuel cell is prototyped through the use of an anaerobic electrolytic cell having a three-liter capacity. A closed hollow cassette provided with a membrane-electrode assembly (MEA) including a cathode and an ion permeable diaphragm that are integrally molded is used as an air cathode (air cathode unit), where the MEA is stretched on both ends of an opening (cross section of about 40×180 mm) penetrating a hollow outer shell frame (about 50×200 mm) having an inlet/outlet.

Five anodes made from carbon felt (an anode, about 50×200 mm) are immersed in an electrolytic cell having a circular cross section and the five closed hollow cassettes are inserted therebetween so as to be opposed to the anodes. Consequently, the microbial fuel cell is provided. Further, the microbial fuel cell is continuously operated while feeding oxygen into the cassette via the inlet/outlet of the closed hollow cassette and flowing artificial wastewater (organic substrates) into the electrolytic cell continuously at specified COD load (1 to 3 kg/m$^3$/day), the artificial wastewater including organic macromolecules such as starch. Soil microorganisms are inoculated into the artificial wastewater as anaerobic microorganisms assuming the responsibility of power generation and the operation of the microbial fuel cell is started under the 500 Ω-constant resistance control.

Figure 13:
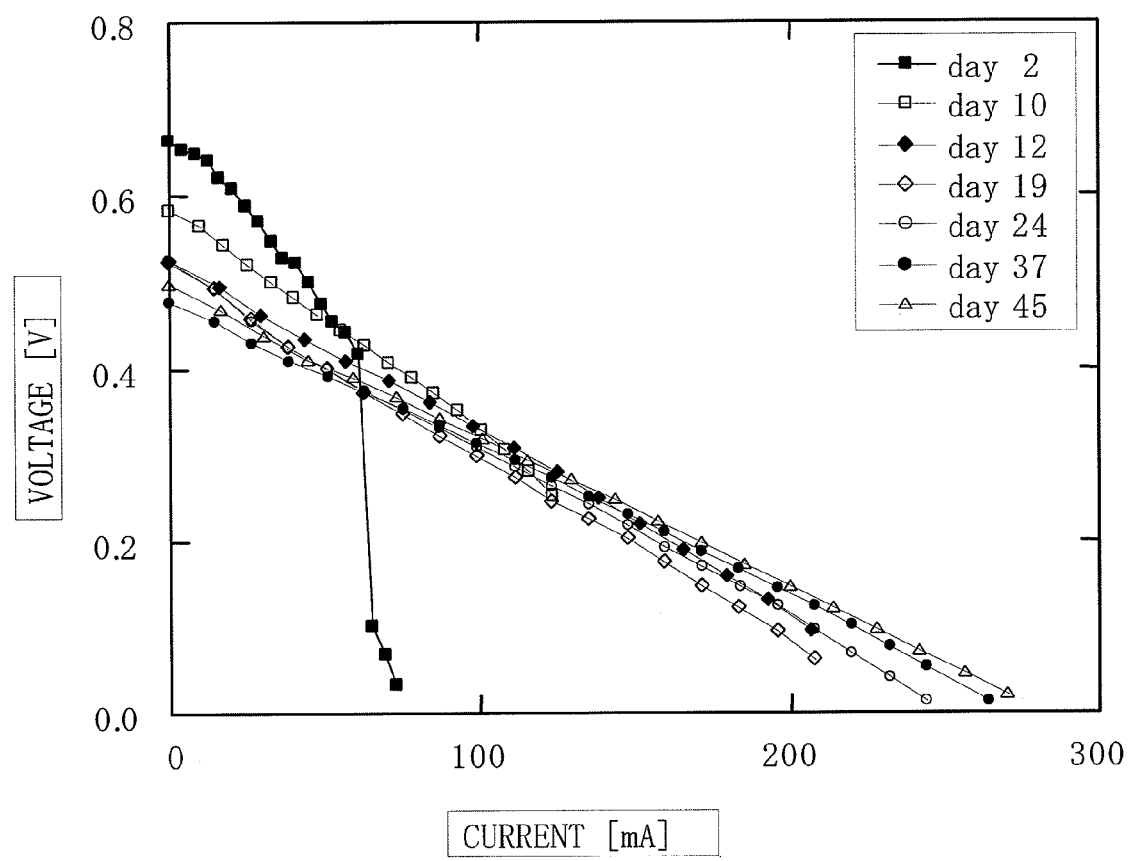
FIG. 13 is a diagram illustrating an exemplary measurement result obtained through an example of the embodiment.
Figure 14:
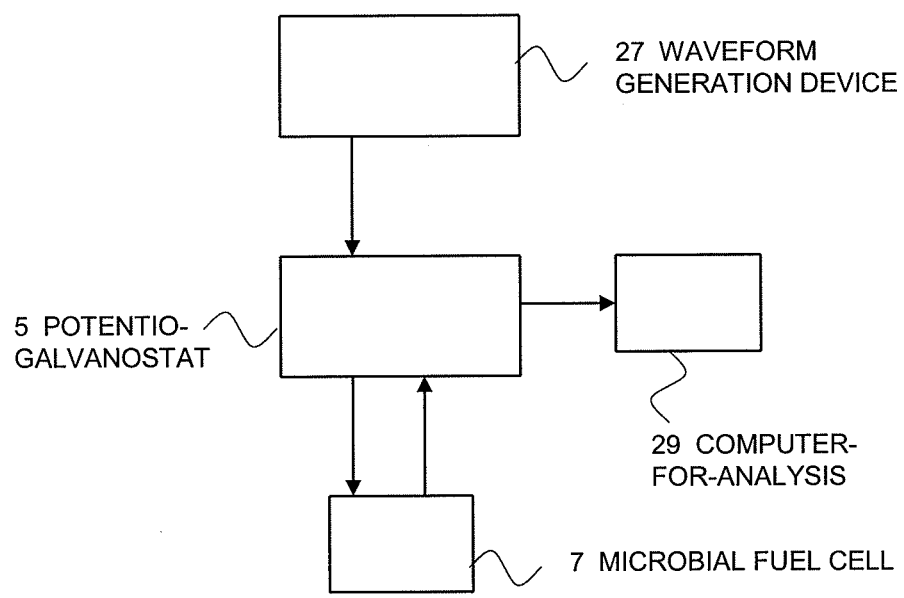
FIG. 14 is a diagram illustrating the configuration of known internal-resistance automatic measurement.
Figure 15:
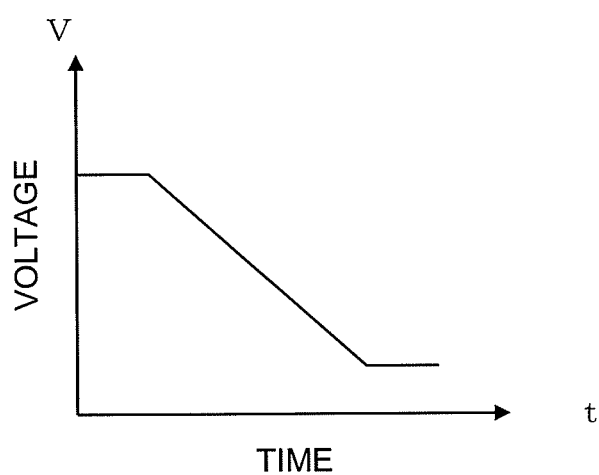
FIG. 15 is a diagram illustrating time changes in the output voltage of the potentio-galvanostat 5, which are observed during the known internal-resistance automatic measurement.
Figure 16:
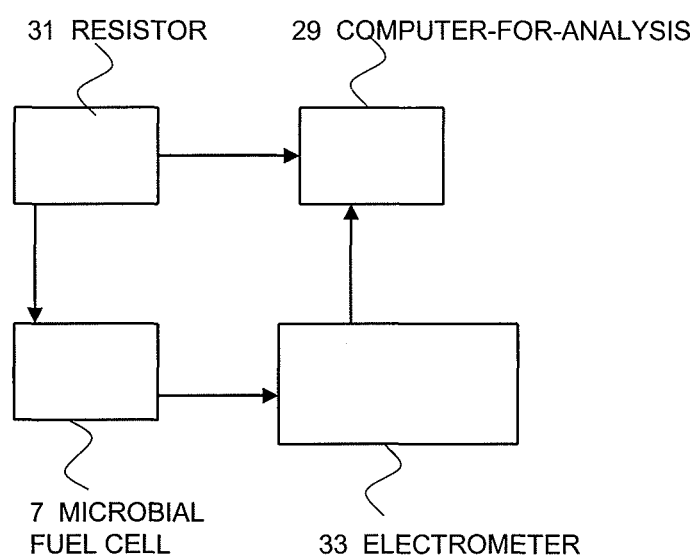
FIG. 16 is a diagram illustrating an exemplary known configuration provided to manually measure an internal resistance.

FIG. 13 is measured data obtained by measuring the microbial fuel cell 7. Although the measurement is performed on a daily basis, extracted data is displayed in FIG. 13. The maximum set value of a current is determined to be 80 mA on the second day, 120 mA on the tenth day, 210 mA on the twelfth to nineteenth days, and 300 mA on the twenty-fourth day and later. Therefore, there is no plot beyond the range of the maximum set-current value for each of the days. During the measurement of the second day, the voltage value sharply fell when the current value exceeds 60 mA or around and the voltage value falls below a set value at 75 mA. Accordingly, the measurement is automatically discontinued. It is considered that the cause of the above-described is insufficient acclimatization of the microbial fuel cell 7 on the second day after the commencement of experiment.

However, as for the plot achieved on the tenth day, all of the plots are linearly arranged, which indicates that the measurement is performed all over the current value range. Further, the internal resistance is calculated with facility. As the power generation capability is increased due to sufficient acclimatization after twenty-four days and forty-five days, it appears that the line inclination becomes gentle and the internal resistance value is decreased. As stated above, it is obvious that the measurement is correctly achieved.

Further, since the current value and the voltage value are calculated, not only the internal resistance of the microbial fuel cell 7, but also the output power can be calculated as a matter of course.

Thus, the internal-resistance measuring devices according to appropriate embodiments of the present invention have been described with reference to the attached drawings. However, the present invention is not limited to the examples. It is evident that those skilled in the art can consider various exemplary modifications and/or corrections within the scope of technical ideas that are disclosed in this application, and it is understood that the various exemplary modifications and/or corrections belong to the technical scope of the present invention as a matter of course.

The invention claimed is:

1. An internal-resistance measuring device measuring an internal resistance of a fuel cell, the internal-resistance measuring device comprising:
   a constant current controller programmed to control a current flowing to the internal-resistance measuring device so that the current attains a current control value,
   a current measurer programmed to measure the current flowing to the internal-resistance measuring device,
   a voltage measurer programmed to measure a voltage changed by the internal-resistance measuring device,
   a calculator programmed to wait until the voltage is stabilized, and
   a recorder programmed to record a value of the current and a value of the voltage after the voltage is stabilized,
   wherein the current control value of the constant current controller is changed, measurement of the current and the voltage is repeated a predetermined number of times, and the internal resistance of the fuel cell is calculated and recorded from a plurality of measurement points.

2. The internal-resistance measuring device according to claim 1,
   wherein the internal-resistance measuring device can switch between enablement and disablement of each of a recording function provided to record a value of a current flowing through the internal-resistance measuring device and the value of the voltage changed by the internal-resistance measuring device on a regular basis, and
   a control function provided to control the current flowing through the internal-resistance measuring device,
   wherein the internal-resistance measuring device starts the internal resistance measurement at predetermined or manual time and returns to a state attained before the measurement is started after the internal resistance-measurement is finished.

3. The internal-resistance measuring device according to claim 1, wherein when the voltage value falls below a predetermined value, control is performed so that the current flowing through the internal-resistance measuring device becomes zero.

4. The internal-resistance measuring device according to claim 2,
   wherein the control function is any one of constant current control provided to perform control so that a predetermined current value flows to the fuel cell,
   constant resistance control provided to perform control so that a current value that should flow when an external resistance with a predetermined resistance value is connected to the fuel cell flows, and voltage control provided to control a current so that the voltage value changed by the internal-resistance measuring device becomes a predetermined voltage value, wherein the current control value is changed for every lapse of specified time.

5. The internal-resistance measuring device according to claim 4, wherein the constant resistance control comprises:

measuring the voltage changed by the internal-resistance measuring device through the voltage measurer, calculating a current that should flow when a predetermined resistance is connected to the fuel cell according to Ohm's law based on the voltage value and the resistance value through the calculator, and controlling the calculated current so that the current flows to the fuel cell through the constant current controller.

6. The internal-resistance measuring device according to claim 4, wherein the internal-resistance measuring device comprises a constant voltage controller configured to control the voltage changed by the internal-resistance measuring device, and wherein the constant resistance control comprises measuring the current flowing through the internal-resistance measuring device through the current measurer, calculating a voltage changed by a predetermined resistance when the predetermined resistance is connected to the fuel cell according to Ohm's law based on the current value and the resistance value through the calculator, and controlling a voltage so that the voltage is changed by as much as the voltage calculated through the internal-resistance measuring device through the constant voltage controller.

7. The internal-resistance measuring device according to claim 1, wherein the fuel cell is a microbial fuel cell, and wherein the internal-resistance measuring device performs acclimatization of the microbial fuel cell and internal resistance measurement.

8. The internal-resistance measuring device according to claim 1, wherein after being changed, the current control value is maintained for a while until the voltage value is stabilized, and is changed in a step manner in relation to the time.

9. The internal-resistance measuring device according to claim 1, wherein the internal-resistance measuring device comprises a current specifier configured to specify the current control value which should be controlled for the constant current controller, and wherein the current specifier sets the current control value to zero when the internal-resistance measuring routine is started, the current specifier increases the current control value by as much as a set interval, when the recorder records the value of the current and the value of the voltage, and when the voltage is lower than the minimum set value or the current is higher than the maximum set value, the internal-resistance measurement routine is finished.

* * * * *